US012772416B2

(12) United States Patent
Kako

(10) Patent No.: US 12,772,416 B2
(45) Date of Patent: Oct. 20, 2026

(54) POWER CONTROL UNIT FOR ELECTRIC VEHICLE

(71) Applicant: AISAN KOGYO KABUSHIKI KAISHA, Obu (JP)

(72) Inventor: Masahiro Kako, Toyota (JP)

(73) Assignee: AISAN KOGYO KABUSHIKI KAISHA, Obu (JP)

( * ) Notice: Subject to any disclaimer, the term of this patent is extended or adjusted under 35 U.S.C. 154(b) by 308 days.

(21) Appl. No.: 18/690,467

(22) PCT Filed: Oct. 5, 2022

(86) PCT No.: PCT/JP2022/037268
§ 371 (c)(1),
(2) Date: Mar. 8, 2024

(87) PCT Pub. No.: WO2023/068048
PCT Pub. Date: Apr. 27, 2023

(65) Prior Publication Data

US 2024/0244790 A1 Jul. 18, 2024

(30) Foreign Application Priority Data

Oct. 19, 2021 (JP) ................................ 2021-170774

(51) Int. Cl.
*H02P 29/68* (2016.01)
*B60L 15/00* (2006.01)
(Continued)

(52) U.S. Cl.
CPC ........ *H05K 7/20272* (2013.01); *B60L 15/007* (2013.01); *H02J 7/855* (2026.01);
(Continued)

(58) Field of Classification Search
CPC .... H02J 2101/24; H02J 3/381; H02J 2101/20; H02J 3/00; H02J 2101/28; H02J 1/102;
(Continued)

(56) References Cited

U.S. PATENT DOCUMENTS

2009/0269622 A1* 10/2009 Aso ........................ B60L 3/003 429/429
2013/0218385 A1* 8/2013 Wenger ................ B60W 10/08 180/65.265
(Continued)

FOREIGN PATENT DOCUMENTS

JP 2000102288 A 4/2000
JP 2004248362 A 9/2004
(Continued)

OTHER PUBLICATIONS

PCT/JP2022/037268 International Preliminary Report on Patentability dated May 2, 2024 (6 p.).
(Continued)

*Primary Examiner* — John W Poos
(74) *Attorney, Agent, or Firm* — CONLEY ROSE, P.C.

(57) ABSTRACT

A power control unit for electric vehicle includes an inverter for controlling a voltage supplied to a vehicle driving motor from a high-voltage battery. A DC/DC converter reduces the voltage of the high-voltage battery to a voltage capable of charging a low-voltage battery serving as a power supply for an in-vehicle auxiliary machine. The power control unit has a circuit board including first electrical circuit elements that constitute the inverter or the DC/DC converter and second electrical circuit elements together with the first electrical circuit elements. The unit further comprises a heat sink for cooling the first electrical circuit elements, a water pump for
(Continued)

circulating a refrigerant in a refrigerant passage of the heat sink, and a water pump control circuit for controlling the operation of the water pump.

3 Claims, 6 Drawing Sheets

(51) Int. Cl.
*H02J 7/00* (2026.01)
*H02P 27/06* (2006.01)
*H05K 7/20* (2006.01)

(52) U.S. Cl.
CPC .............. *H02P 27/06* (2013.01); *H02P 29/68* (2016.02); *H05K 7/209* (2013.01); *H05K 7/20927* (2013.01); *B60L 2210/10* (2013.01); *H02J 2207/20* (2020.01)

(58) Field of Classification Search
CPC ...... H02J 15/00; H02J 3/04; H02J 7/35; H02J 3/32; H02J 7/345; H02J 3/28; H02J 1/14; H02J 2105/37; H02J 7/34; H02J 2207/20; H02J 1/10; H02J 7/865; H02J 2101/25; H02J 2101/30; H02J 7/342; H02J 3/38; H02J 7/02; H02J 1/106; H02J 1/12; H02J 3/388; H02J 2105/42; H02J 15/50; H02J 7/60; H02J 9/062; H02J 3/14; H02J 7/663; H02J 7/855; H02J 2103/30; H02J 3/003; H02J 7/1423; H02J 7/82; H02J 9/061; H02J 1/00; H02J 2101/10; H02J 3/001; H02J 7/00; H02J 7/06; H02J 7/14; H02J 3/40; H02J 3/46; H02J 7/70; H02J 7/80; H02J 9/068; H02J 13/13; H02J 13/1331; H02J 15/10; H02J 2105/10; H02J 2105/12; H02J 2105/30; H02J 2207/50; H02J 3/004; H02J 3/02; H02J 3/322; H02J 3/466; H02J 3/48; H02J 50/005; H02J 50/12; H02J 50/402; H02J 50/80; H02J 50/90; H02J 7/52; H02J 7/667; H02J 7/94; H02J 7/971; H02J 7/975; H02J 7/977; H02J 9/066; H02J 9/08; H02J 1/082; H02J 13/00; H02J 13/10; H02J 2101/40; H02J 2105/33; H02J 2105/52; H02J 2105/59; H02J 7/32; H02J 7/56; H02J 7/61; H02J 7/62; H02J 7/63; H02J 7/90; H02J 9/04; H02J 9/06; B60L 1/003; B60L 58/33; B60L 2210/10; B60L 58/40; B60L 2240/36; B60L 50/16; B60L 2210/40; B60L 58/26; B60L 58/30; B60L 1/02; B60L 2240/545; B60L 58/20; B60L 1/00; B60L 2200/40; B60L 50/51; B60L 50/71; B60L 50/62; B60L 58/34; B60L 58/27; B60L 15/20; B60L 2240/525; B60L 2240/34; B60L 15/2045; B60L 50/72; B60L 3/0053; B60L 2240/421; B60L 15/007; B60L 2240/662; B60L 2250/10; B60L 50/60; B60L 58/12; B60L 50/75; B60L 2240/547; B60L 50/40; B60L 50/61; B60L 50/70; B60L 2240/622; B60L 58/31; B60L 7/14; B60L 2240/12; B60L 2240/549; B60L 3/0046; B60L 2240/425; B60L 2250/30; B60L 3/003; B60L 50/66; B60L 50/64; B60L 2210/14; B60L 2210/30; B60L 2240/423; B60L 2240/445; B60L 2240/80; B60L 58/10; B60L 3/0061; B60L 58/21; B60L 58/32; B60L 2200/12; B60L 2210/12; B60L 53/11; B60L 2200/26; B60L 2260/44; B60L 50/50; B60L 58/15; B60L 1/14; B60L 2240/441; B60L 3/04; B60L 53/22; B60L 53/302; B60L 2250/16; B60L 3/00; B60L 58/13; B60L 2250/26; B60L 2260/26; B60L 2260/28; B60L 53/00; B60L 58/14; B60L 58/24; B60L 2200/36; B60L 3/0023; B60L 3/0069; B60L 53/16; B60L 55/00; B60L 1/06; B60L 15/2009; B60L 3/0007; B60L 3/12; B60L 53/14; B60L 53/18; B60L 58/18; B60L 9/02; B60L 2240/443; B60L 2240/507; B60L 2260/56; B60L 2270/46; B60L 53/20; B60L 53/31; B60L 53/66; B60L 7/10; B60L 1/006; B60L 15/02; B60L 15/10; B60L 15/2072; B60L 2200/16; B60L 2200/22; B60L 2200/42; B60L 2240/10; B60L 2240/40; B60L 2240/42; B60L 2240/486; B60L 2270/44; B60L 3/0084; B60L 50/11; B60L 50/13; B60L 53/24; B60L 53/60; B60L 58/22; B60L 58/25; B60L 7/18; B60L 7/26; B60L 1/08; B60L 2200/32; B60L 2260/14; B60L 2260/162; B60L 2260/165; B60L 2260/167; B60L 2260/58; B60L 3/0092; B60L 50/15; B60L 50/53; B60L 53/305; B60L 53/36; B60L 53/62; B60L 53/65; B60L 2220/42; B60L 2220/44; B60L 2240/44; B60L 2240/461; B60L 2240/54; B60L 2240/62; B60L 2240/642; B60L 2250/12; B60L 2260/32; B60L 2260/40; B60L 2270/12; B60L 2270/145; B60L 3/06; B60L 50/10; B60L 50/52; B60L 53/53; B60L 53/665; B60L 58/00; B60L 7/08; B60L 7/16; B60L 1/04; B60L 15/2054; B60L 2220/14; B60L 2220/50; B60L 2240/32; B60L 2240/46; B60L 2240/527; B60L 2250/24; B60L 2260/52; B60L 2260/54; B60L 53/30; B60L 9/18; H05K 7/20272; H05K 7/209; H05K 7/20927; H02P 27/06; H02P 29/68; H02M 1/10; H02M 3/003; H02M 7/003; Y02T 10/72
See application file for complete search history.

(56) References Cited

U.S. PATENT DOCUMENTS

| | | | | |
|---|---|---|---|---|
| 2013/0288148 | A1* | 10/2013 | Kazuno ............. | H01M 8/04619 429/444 |
| 2016/0006060 | A1* | 1/2016 | Kwon ............... | H01M 8/04753 429/442 |
| 2018/0138827 | A1 | 5/2018 | Goto | |
| 2019/0021181 | A1 | 1/2019 | Tomokage et al. | |
| 2020/0100393 | A1* | 3/2020 | Xiang ...................... | H05K 1/18 |
| 2021/0194023 | A1* | 6/2021 | Morinaga ......... | H01M 8/04097 |
| 2021/0323396 | A1* | 10/2021 | Kim ......................... | B60K 1/04 |

FOREIGN PATENT DOCUMENTS

| | | | |
|---|---|---|---|
| JP | 2004304935 | A | 10/2004 |
| JP | 2012239337 | A | 12/2012 |
| JP | 2017060261 | A | 3/2017 |
| JP | 2019022285 | A | 2/2019 |
| JP | 2019060274 | A | 4/2019 |
| WO | 2017/038022 | A1 | 3/2017 |

(56) References Cited

FOREIGN PATENT DOCUMENTS

OTHER PUBLICATIONS

PCT/JP2022/037268 International Search Report and Written Opinion dated Dec. 13, 2022 (11 p.).

* cited by examiner

POWER CONTROL UNIT FOR ELECTRIC VEHICLE

CROSS-REFERENCE TO RELATED APPLICATIONS

The present application is a 35 U.S.C. § 371 U.S. National Phase entry of, and claims priority to, PCT Application PCT/JP2022/037268 filed Oct. 5, 2022, which claims priority to Japanese Patent Application No. 2021-170774 filed Oct. 19, 2021, each of which is hereby incorporated herein by reference in its entirety for all purposes.

STATEMENT REGARDING FEDERALLY SPONSORED RESEARCH OR DEVELOPMENT

Not applicable.

BACKGROUND

The present disclosure relates generally to power control units for electric vehicles.

Electric vehicles include battery electric vehicles, hybrid electric vehicles, plug-in hybrid electric vehicles, and fuel cell vehicles, etc. Each of the electric vehicles includes a high-voltage battery that serves as a power source for a vehicle driving motor and a low-voltage battery that serves as a power source for auxiliary equipment in the vehicle. The electric vehicle also has a power control unit that appropriately controls the vehicle driving motor, and a generator, etc. The power control unit includes an inverter and a DC/DC converter. The inverter controls the voltage supplied to the vehicle driving motor based upon the vehicle load condition. The DC/DC converter reduces the voltage level of the high-voltage battery to a voltage level capable of charging the low-voltage battery.

In the electric vehicle, the need for downsizing of mounted parts is high because of the large capacity and size of the high-voltage battery. In a conventional power control unit, a water pump used to cool a power control unit is configured to be fixed to a case of the power control unit. This can eliminate mounting brackets and other parts that are required when mounting the water pump to the vehicle body. As a result, the entire system can be downsized. However, the individual components themselves remain unchanged and there is room for further improvement. Accordingly, there has been a need for improved power control units.

SUMMARY

In one aspect of the present disclosure, an electric vehicle includes a high-voltage battery that serves as a power source for a vehicle driving motor and a low-voltage battery that serves as a power source for auxiliary equipment in the vehicle. An inverter controls the voltage supplied from the high-voltage battery to the vehicle driving motor A DC/DC converter is adjustable to reduce the voltage level of the high-voltage battery to a voltage level that can charge the low-voltage battery. First electric circuit devices constituting the inverter or the DC/DC converter are mounted on a circuit board. The first electric circuit devices are cooled by a heat sink. A water pump circulates a refrigerant through the refrigerant passage of the heat sink. A water pump control circuit controls the operation of the water pump. Second electric circuit devices constituting the water pump control circuit are mounted on the circuit board together with the first electric circuit devices.

DETAILED DESCRIPTION

<Example of Hybrid Electric Vehicle Configuration>

Figure 1:
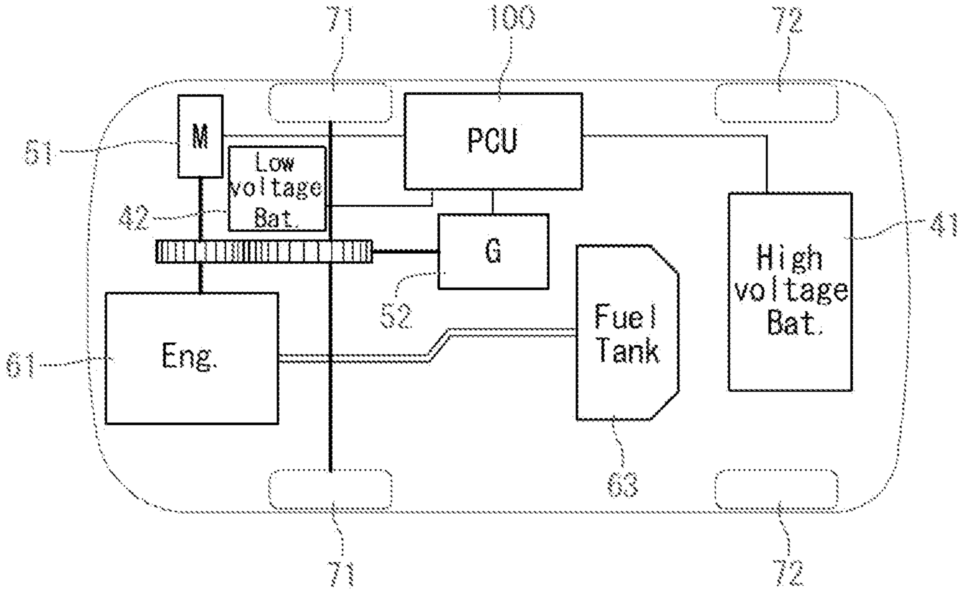
FIG. 1 is a system configuration diagram of a hybrid electric vehicle that has a power control unit.
Figure 3:
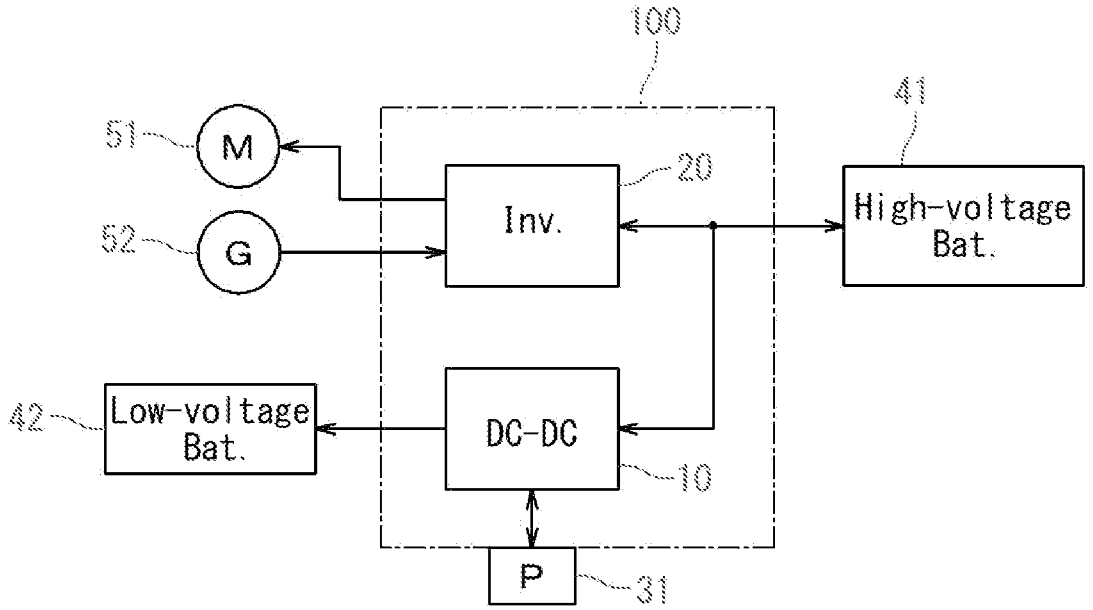
FIG. 3 is a system configuration diagram of the embodiment of the power control unit and its surroundings.

FIG. 1 shows an example of a general hybrid electric vehicle. This hybrid electric vehicle has four wheels, including drive wheels 71 and driven wheels 72. The left and right drive wheels 71 are driven by an engine 61 and a vehicle driving motor 51 (hereinafter simply referred to as "motor") to drive the hybrid electric vehicle. The hybrid electric vehicle includes a power control unit 100. The power control unit 100 operates the motor 51 to rotate the drive wheels 71 according to the vehicle load. The generator 52 generates electricity to charge a high-voltage battery 41 that powers the motor 51. As shown in FIG. 3, the power control unit 100 controls the generator 52 to regulate the voltage supplied to the motor 51. The power control unit 100 has an inverter to convert the output of the generator 52 to alternating current. The power control unit 100 includes a DC/DC converter 10. To charge a low voltage battery 42 by the high voltage battery 41, the DC/DC converter 10 drops down the high voltage level of the high-voltage battery 41 to a voltage level capable of charging the low-voltage battery 42. The low-voltage battery 42 is used to power auxiliary equipment in the vehicle. As shown in FIG. 1, the hybrid electric vehicle has a fuel tank 63 that supplies fuel to the engine 61.

Summary of Configuration of One Embodiment

Figure 2:
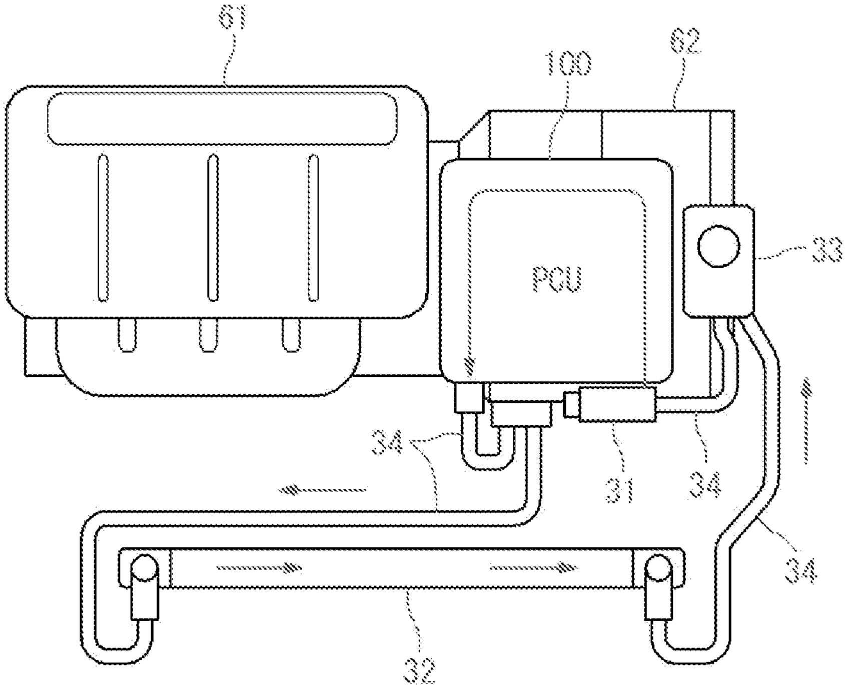
FIG. 2 is an external view of an embodiment of the power control unit of the hybrid electric vehicle.
Figure 4:
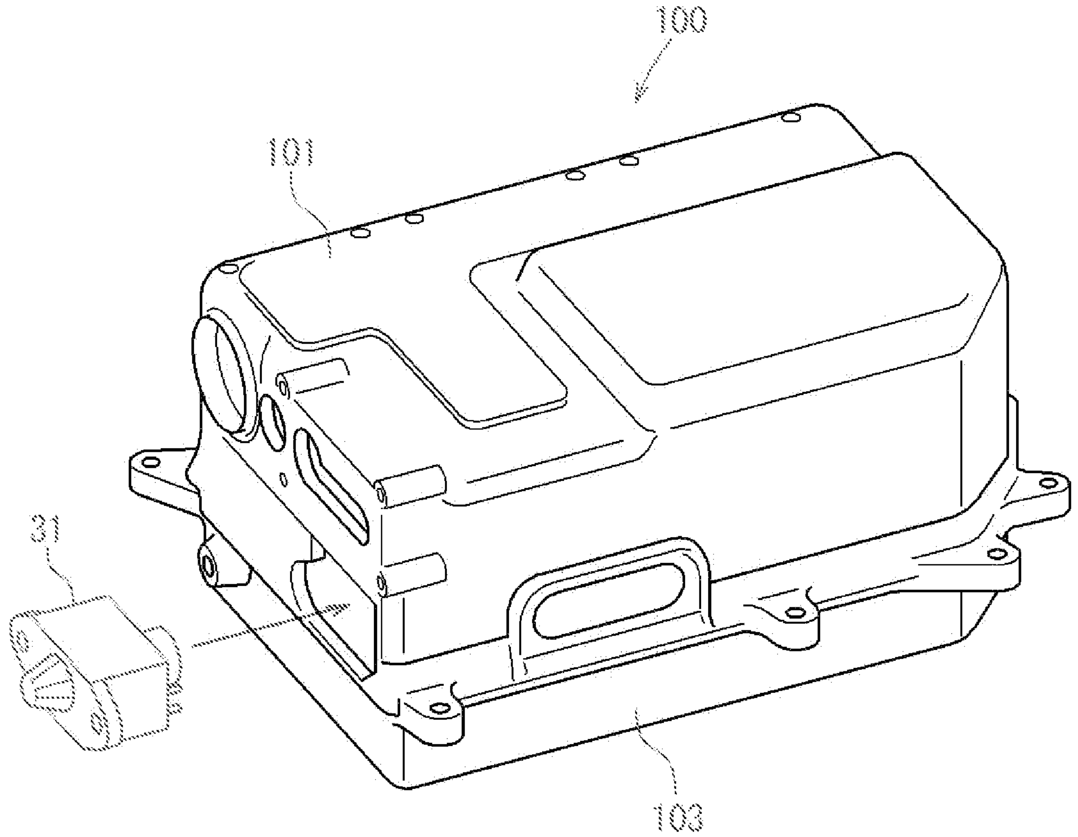
FIG. 4 is an external perspective view of the power control unit with a water pump removed from a housing.
Figure 5:
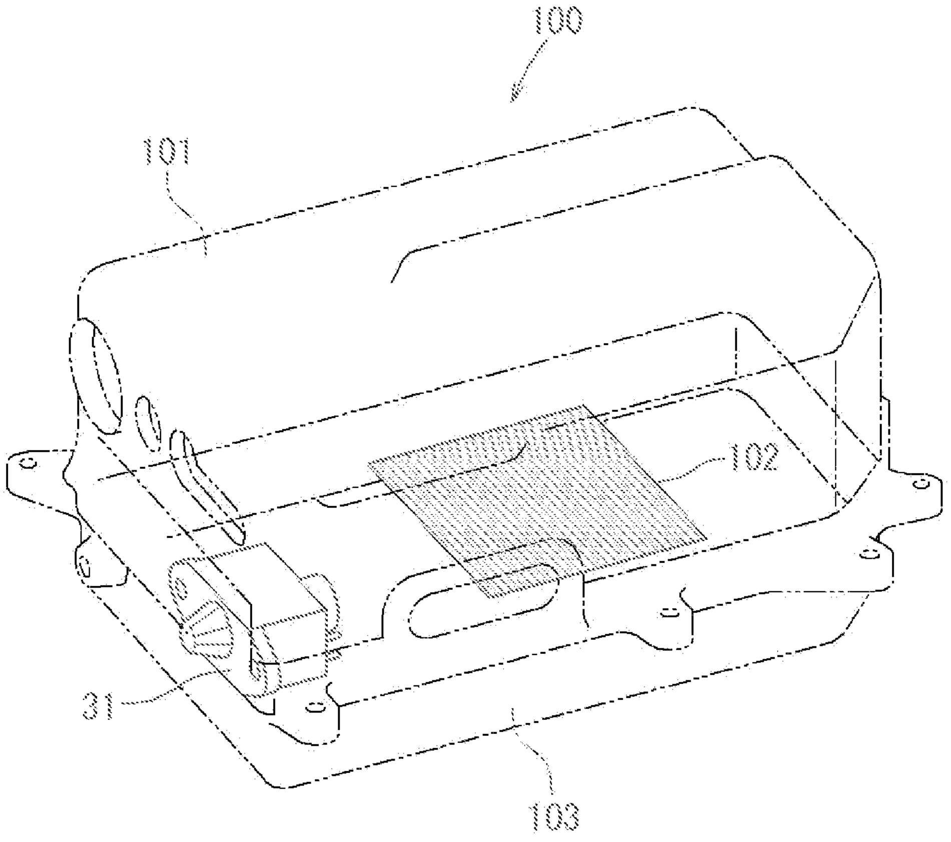
FIG. 5 is a perspective view of the power control unit, illustrating the water pump and a circuit board in solid lines.

FIGS. 2 to 5 show an embodiment of the power control unit 100. In this embodiment, the power control unit 100 of the hybrid electric vehicle integrally has a water pump 31 of a cooling system that cools the power control unit 100. As shown in FIGS. 2, 4, and 5, the water pump 31 is coupled and secured to a housing 101 of the power control unit 100. As shown in FIG. 3, a control circuit (not shown) for the water pump 31 is integrated into a DC/DC converter 10 in the power control unit 100. FIG. 5 shows a circuit board 102 of the DC/DC converter 10 including a water pump control circuit. A heat sink 103 is located at the bottom of the circuit board 102 to cool the circuit board 102. Accordingly, the heat sink 103 cools first electrical circuit devices (not shown) constituting the DC/DC converter 10 and second electrical circuit devices (not shown) constituting the water pump control circuit.

As shown in FIG. 3, the power control unit 100 includes an inverter 20 and the DC/DC converter 10 therein. As mentioned above, the inverter 20 is interposed between the high-voltage battery 41 and the motor 51 and between the high-voltage battery 41 and the generator 52. The DC/DC converter 10 is interposed between the high-voltage battery 41 and the low-voltage battery 42. A water pump control circuit (not shown) integrated into the DC/DC converter 10 drives and controls the water pump 31. The water pump control circuit may be integrated into the inverter 20 instead of being integrated into the DC/DC converter 10.

As shown in FIG. 2, the water pump 31 is disposed in the middle of a refrigerant passage 34 through which a refrigerant (not shown) supplied from a reserve tank 33 flows. A radiator 32 is also disposed in the middle of the refrigerant passage 34. Thus, the refrigerant from the reserve tank 33 flows from the water pump 31 to the heat sink (not shown) of the power control unit 100, as indicated by arrows in FIG. 2. The refrigerant thereby cools each electric circuit device (not shown) in the power control unit 100. A transaxle 62 is located below the power control unit 100. The refrigerant passage 34 downstream from the heat sink is piped to cool the generator 52 (not shown in FIG. 2) in the transaxle 62. The refrigerant returning from the generator 52 radiates heat at the radiator 32 and returns to the reserve tank 33. The above-described piping pattern of the refrigerant passage 34 is an example and may be changed to another pattern different from this depending on the situation.

<Example of General DC/DC Converter Configuration>

Figure 6:
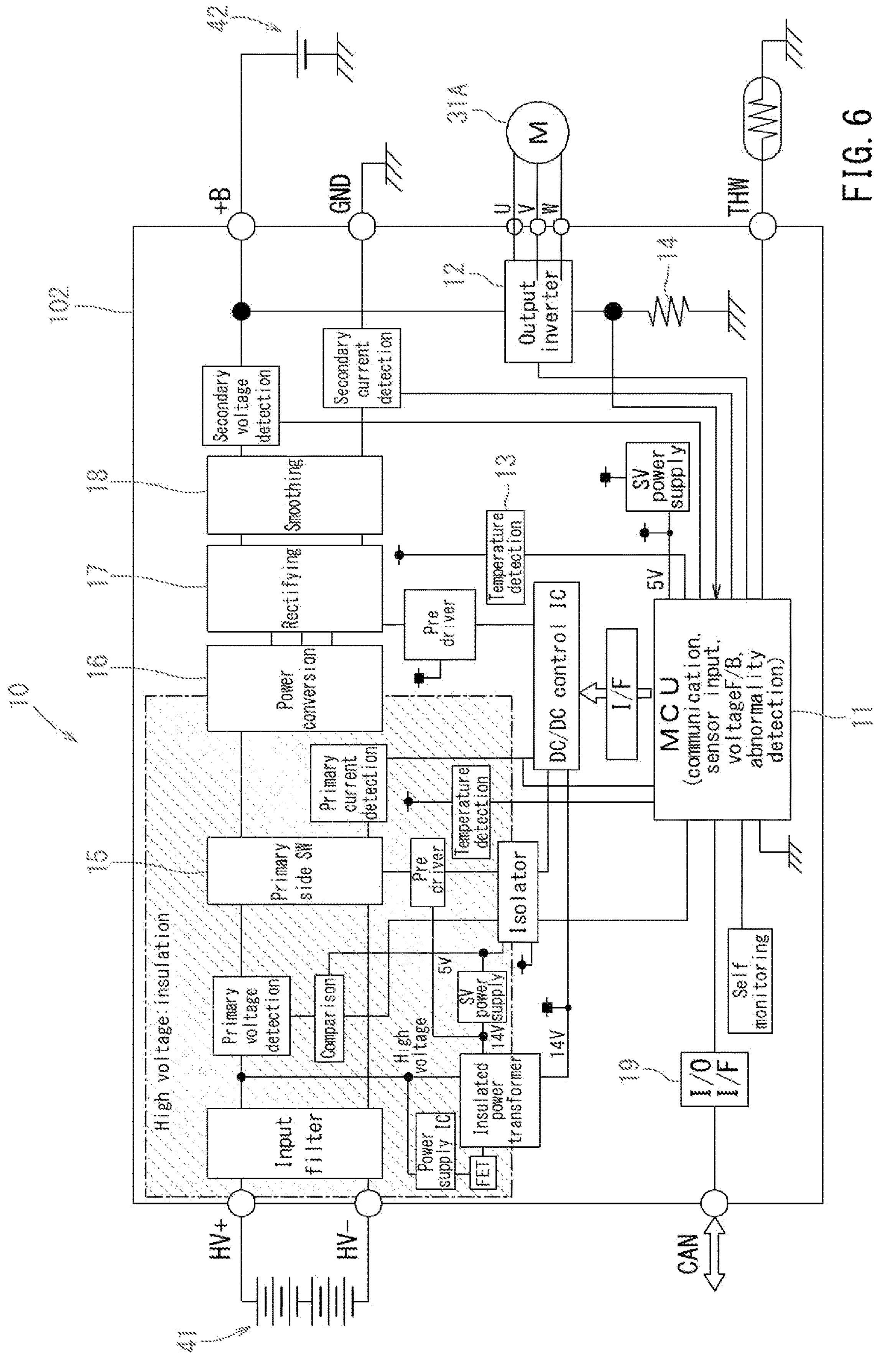
FIG. 6 is a block circuit diagram of an embodiment of a DC/DC converter that is integrated with a water pump control circuit.
Figure 7:
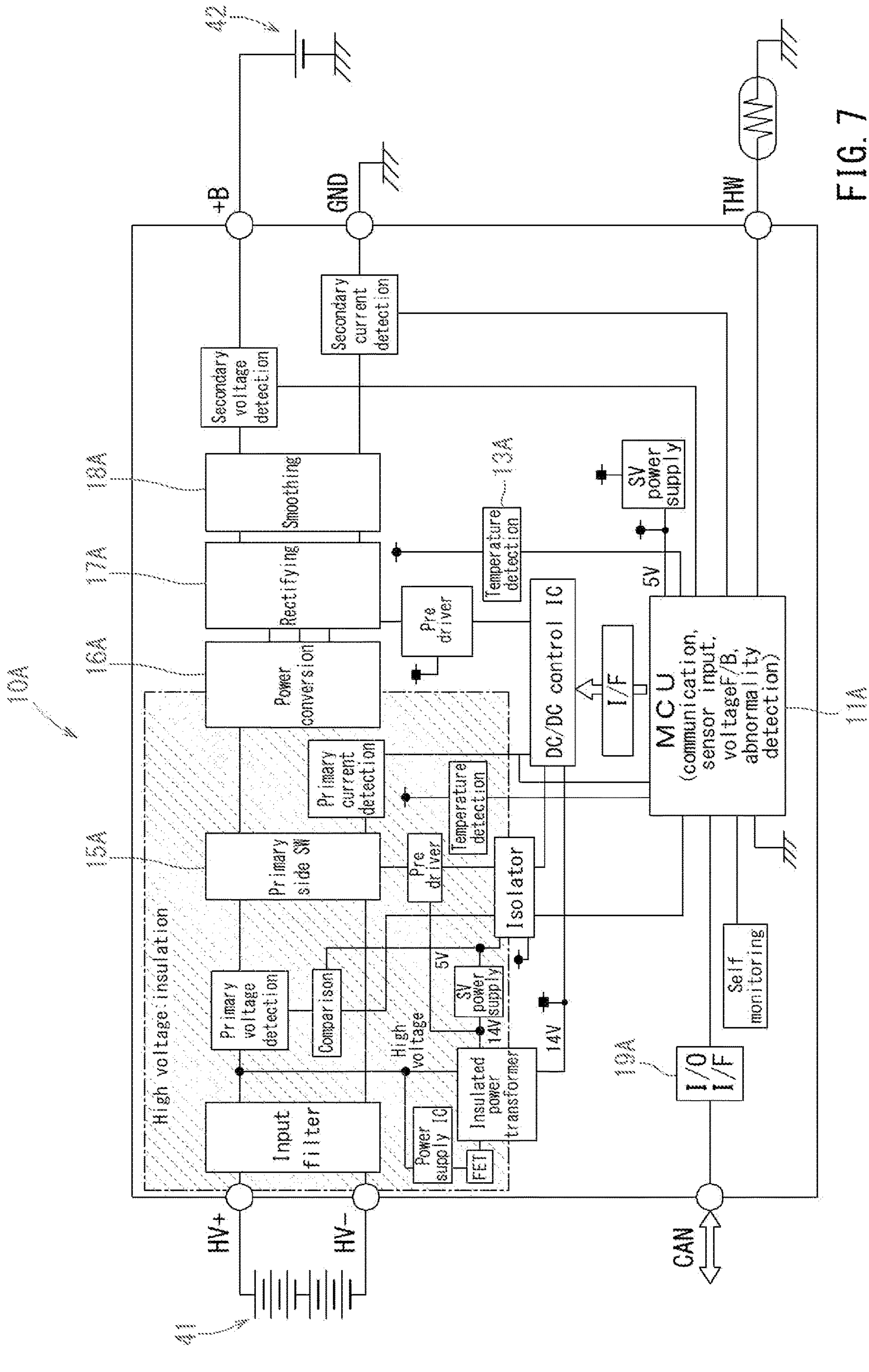
FIG. 7 is a block circuit diagram of the DC/DC converter of FIG. 6 before that is integrated with the water pump control circuit.

FIG. 6 shows the DC/DC converter 10 in which the water pump control circuit is incorporated. FIG. 7 shows a general DC/DC converter 10A in which no water pump control circuit is incorporated. The DC/DC converter 10A is connected between the high-voltage battery 41 and the low-voltage battery 42. The DC/DC converter 10A converts the voltage of the high-voltage battery 41 to a voltage suitable for charging the low-voltage battery 42. The DC/DC converter 10A has a power converter 16A including the transformer (not shown). In FIG. 7, the left side of the power converter 16A is the primary side (high-voltage side) and the right side is the secondary side (low-voltage side). On the primary side, a half-bridge type primary side switch circuit 15A is connected to open and close the primary side circuit of the transformer. On the secondary side, a rectifier circuit 17A and a smoothing circuit 18A are connected to convert the AC current on the secondary side of the transformer to DC current.

As shown in FIG. 7, the DC/DC converter 10A has a micro controller unit 11A (hereinafter referred to as MCU), which includes a computer processor. The MCU 11A controls on/off states of the primary side switch circuit 15A and the switching elements (not shown) in the rectifier circuit 17A to properly charge the low-voltage battery 42. Thus, the MCU 11A forms a power conversion control circuit that controls power conversion in the DC/DC converter 10A. The MCU 11A receives signals from a temperature sensor 13A that detects the temperature on the secondary circuit side of the circuit board. The MCU 11A is connected to an input/output circuit 19A to input signals of the inverter (not shown) from the outside of the DC/DC converter 10A.

<Example of General Water Pump Configuration>

Figure 8:
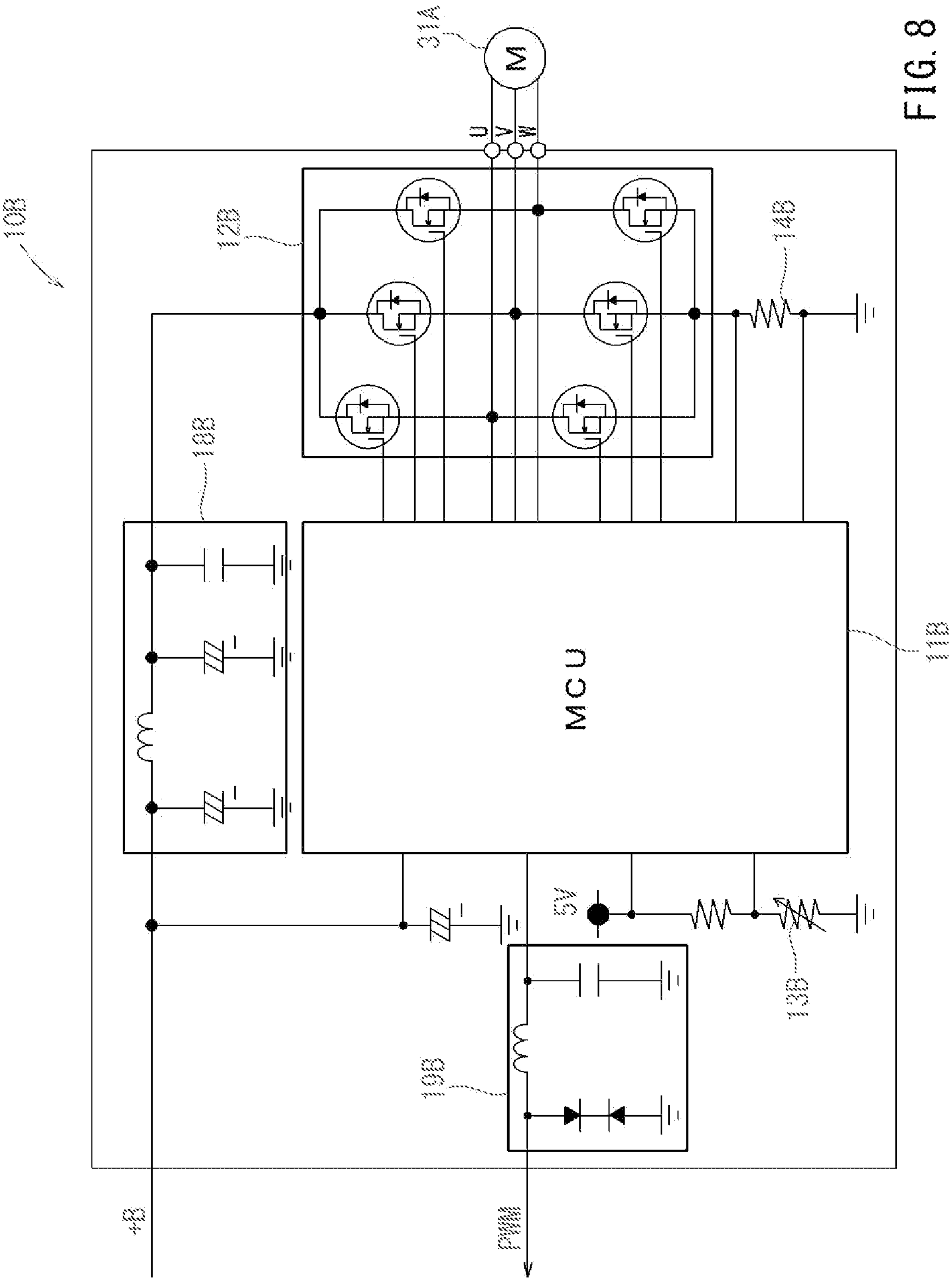
FIG. 8 is a block circuit diagram of the water pump control circuit of FIG. 6, which is not integrated into the DC/DC converter.

FIG. 6 shows the DC/DC converter 10 that includes a water pump control circuit 10B. FIG. 8 shows the generic water pump control circuit 10B that is not incorporated in the DC/DC converter 10. The water pump control circuit 10B has an output inverter 12B, which is an output circuit. The output inverter 12B has six switching elements connected in a dree-phase bridge. The output inverter 12B operates a water pump driving motor 31A, which is a brushless motor, by outputs signals from the UVW wiring. The water pump control circuit 10B has an MCU 11B including a computer processor. The MCU 11B receives pulse-width modulation (PWM) input signals and controls the on/off state of each switching element of the output inverter 12B to control the rotation speed of the water pump driving motor 31A. Accordingly, the MCU 11B forms a motor control circuit that controls the rotation speed of the water pump driving motor 31A. The water pump control circuit 10B controls the rotation speed of the water pump driving motor 31A based on the pulse-width modulation input signals.

As shown in FIG. 8, an input filter circuit 18B for noise rejection is connected to the power supply side of the output inverter 12B. In addition, an overcurrent detection resistor 14B is connected to the ground side of the output inverter 12B. An input signal processing circuit 19B is connected to the circuit that inputs pulse-width modulation signals to the MCU 11B. The input signal processing circuit 19B converts the pulse-width modulation signal into a signal with an amplitude corresponding to the pulse width of the pulse-width modulation signal. The MCU 11B receives detection signals from the temperature sensor 13B that detects the temperature of the circuit board.

Detailed Configuration of One Embodiment

FIG. 6 shows one embodiment of the DC/DC converter 10. In this DC/DC converter 10, the DC/DC converter 10A of FIG. 7 is integrated with the water pump control circuit 10B of FIG. 8. Thus, the DC/DC converter 10 has a primary side switch circuit 15, a power converter 16, a rectifier circuit 17, a smoothing circuit 18, an input/output circuit 19, and a temperature sensor 13 similar to the DC/DC converter 10A.

In the MCU 11 of the DC/DC converter 10 in FIG. 6, the MCU 11B of the water pump control circuit 10B in FIG. 8 is integrally incorporated into the MCU 11A of the DC/DC converter 10A in FIG. 7. Thus, the MCU 11 in FIG. 6 performs the on/off controls of the primary side switch circuit 15 and the switching elements in the rectifier circuit 17. The MCU 11 functions as a power conversion control circuit that controls power conversion in the DC/DC converter 10, similar to the MCU 11A in FIG. 7. The MCU 11 also functions to output control signals to an output inverter 12 (also referred to as output circuit) in FIG. 6, which is the same as the output inverter 12B in the water pump control circuit 10B in FIG. 8. Each control of the primary side switch circuit 15, the rectifier circuit 17, and the output inverter 12 by the MCU 11 in FIG. 6 is executed by programs stored in advance in the memory (not shown) of the MCU 11. The MCU 11 can combine a CPU (central processing unit) of the MCU 11A and a CPU of the MCU 11B into a single unit, thereby simplifying the configuration compared to the case where the MCU 11A and the MCU 11B are provided separately. In addition, the power control unit 100 can be downsized and costs can be reduced.

As shown in FIG. 6, the output inverter 12 is mounted on the circuit board 102 of the DC/DC converter 10. Accordingly, the six switching elements (corresponding to the second electrical circuit devices) that constitute the output inverter 12 are connected to the appropriate spaces on the circuit board 102 of the DC/DC converter 10. Since the current capacity of the output inverter 12 is very small compared to that of the DC/DC converter 10 (e.g., 3 A:100 A), the output inverter 12 can be placed in a small space on the circuit board 102. The power supply circuit of the output inverter 12 is connected to the output side of the smoothing circuit 18 of the DC/DC converter 10. Thus, the smoothing circuit 18 of the DC/DC converter 10 serves as the input filter circuit 18B of the water pump control circuit 10B in FIG. 8. The smoothing circuit 18 has L (inductance) and C (capacitance) components inside and smooths the pulsating direct current from the rectifier circuit 17. The smoothing circuit 18 can also function as the input filter circuit 18B of the water pump control circuit 10B in FIG. 8. Thus, the DC/DC converter 10 of FIG. 6 can omit the input filter circuit 18B of FIG. 8. As illustrated in FIG. 6, an overcurrent detection resistor 14 similar to the overcurrent detection resistor 14B of the general water pump control circuit 10B of FIG. 8 is connected to the ground side of the output inverter 12. The configurations, which are illustrated in FIG. 6 and are not described herein, correspond to conventionally known configurations.

As shown in FIG. 6, the second electrical circuit devices constituting the output inverter 12 are connected on the circuit board 102 of the DC/DC converter 10. Thus, the wiring length of the power supply circuit of the output inverter 12 can be shortened. Moreover, the power supply circuit of the output inverter 12 can be kept from being exposed outside the housing 101 shown in FIG. 5. The housing 101 is made of aluminum and has a noise shielding function. Accordingly, noise superimposed on the power supply circuit of the output inverter 12 from the outside can be suppressed. The smoothing circuit 18 of the DC/DC converter 10 in FIG. 6 replaces the input filter circuit (18B in FIG. 8) of the output inverter 12. Therefore, the input filter circuit 18B can be omitted. As a result, the decrease in the voltage supplied to the output inverter 12 is suppressed by the voltage drop at the input filter circuit 18B.

As shown in FIG. 6, there is an input terminal CAN for multiplex communication signals, which inputs signals to the input/output circuit 19. In addition to the signals from the inverter 20 as shown in FIG. 3, input signals to control the water pump (corresponding to the PWM signals in FIG. 8) are also input to the input terminal CAN. Thus, the input/output circuit 19 in FIG. 6 also serves as the input signal processing circuit 19B of the water pump control circuit 10B in FIG. 8. Accordingly, in the DC/DC converter 10 of FIG. 6, the input signal processing circuit 19B of FIG. 8 can be omitted. As a result, the circuit configuration can be simplified. In addition, the power control unit 100 can be downsized and costs can be reduced.

As shown in FIGS. 6 to 8, each circuit of the DC/DC converters 10, 10A and the water pump control circuit 10B consists of a combination of several electrical circuit elements, such as the primary side switch circuits 15, 15A, the power converters 16, 16A, the MCUs 11, 11A, 11B, etc., enclosed in square blocks in each figure. Among the electric circuit elements, the electric circuit elements constituting the water pump control circuit 10B correspond to the pump electric circuit elements, and the electric circuit elements constituting the DC/DC converter 10 or 10A correspond to the converter electric circuit elements. Each electric circuit element is formed by assembling electric circuit devices such as ICs, switching elements, capacitors, diodes, and resistors selected according to the function of each electric circuit element on a circuit board, which is a printed circuit board.

Other Embodiments

Although the technology disclosed herein is described above in a specific embodiment, it can be implemented in various other forms. For example, the water pump is fixed to the housing of the power control unit in the above embodiment, but it can also be fixed to a heat sink. In FIG. 6, the circuit board on which the first electrical circuit devices constitute the inverter are mounted is integrated with the circuit board on which the first electrical circuit devices constitute the DC/DC converter. Alternatively, the circuit board on which the first electric circuit devices constituting the inverter may be formed separately from the circuit board on which the first electric circuit devices constitute the DC/DC converter. In this case, the second electric circuit devices that constitute the water pump control circuit are mounted on any one of the circuit boards.

The invention claimed is:

1. A power control unit for an electric vehicle, comprising:

an inverter configured to control a voltage supplied from a high-voltage battery to a vehicle driving motor;

a DC/DC converter configured to reduce a voltage level of the high-voltage battery to a voltage level for charging a low-voltage battery that is a power source for an in-vehicle auxillary equipment;

a circuit board including a plurality of first electrical circuit devices that constitute one of the inverter and the DC/DC converter;

a heat sink configured to cool the plurality of first electrical circuit devices;

a water pump configured to circulate a refrigerant through a refrigerant passage of the heat sink; and water pump control circuit configured to control an operation of the water pump, wherein a plurality of second electric circuit devices that constitute the water pump control circuit is mounted on the circuit board together with the plurality of first electric circuit devices, wherein one of pump electric circuit elements that constitute the water pump control circuit is incorporated into a plurality of converter electrical circuit elements that constitute the DC/DC converter;

wherein the pump electric circuit elements of the water pump control circuit include an input filter circuit configured to remove noise from a power supply circuit, wherein the plurality of converter electrical circuit elements of the DC/DC converter includes a smoothing circuit configured to smooth a pulsating direct current rectified from AC current after power conversion, and wherein the water pump control circuit is connected to the DC/DC converter for making the smoothing circuit function as the input filter circuit.

2. A power control unit for an electric vehicle, comprising:

an inverter configured to control a voltage supplied from a high voltage battery to a vehicle driving motor;

a DC/DC converter configured to reduce a voltage level of the high-voltage battery to a voltage level for charging a low-voltage battery that is a power source for an in-vehicle auxiliary equipment;

a circuit board including a plurality of first electrical circuit devices that constitute one of the inverter and the DC/DC converter;

heat sink configured to cool the plurality of first electrical circuit devices;

a water pump configured to circulate a refrigerant through a refrigerant passage of the heat sink; and a water pump control circuit configured to control an operation of the water pump, wherein a plurality of second electric circuit devices that constitute the water pump control circuit is mounted on the circuit board together with the plurality of first electric circuit devices;

wherein one of pump electric circuit elements that constitute the water pump control circuit is incorporated into a plurality of converter electrical circuit elements that constitute the DC/DC converter;

wherein the pump electrical circuit elements of the water pump control circuit include a motor control circuit that controls a rotation of a water pump driving motor, wherein the plurality of converter electrical circuit elements of the DC/DC converter includes a power conversion control circuit that controls power conversion by a transformer and, wherein the power conversion control circuit includes a computer processor configured to be integrated by the motor control circuit.

3. A power control unit for an electric vehicle, comprising:

an inverter configured to control a voltage supplied from a high-voltage battery to a vehicle driving motor;

a DC/DC converter configured to reduce a voltage level of the high-voltage battery to a voltage level for charging a low-voltage battery that is a power source for an in-vehicle auxiliary equipment;

a circuit board including a plurality of first electrical circuit devices that constitute one of the inverter and the DC/DC converter;

a heat sink configured to cool the plurality of first electrical circuit devices;

a water pump configured to circulate a refrigerant through a refrigerant passage of the heat sink; and a water pump control circuit configured to control an operation of the water pump, wherein a plurality of second electric circuit devices that constitute the water pump control circuit is mounted on the circuit board together with the plurality of first electric circuit devices, wherein one of pump electric circuit elements that constitute the water pump control circuit is incorporated into a plurality of converter electrical circuit elements that constitute the DC/DC converter;

wherein the pump electrical circuit elements of the water pump control circuit include a motor control circuit and an output circuit, wherein the motor control circuit is configured to control a rotation of a motor for driving the water pump, wherein the output circuit is configured to receive outputs from the motor control circuit for controlling voltage supplied to the motor for driving the water pump, and wherein the plurality of second electrical circuit devices that constitute the output circuit is mounted on the circuit board together with the plurality of first electrical circuit devices that constitute the DC/DC converter.

* * * * *